March 2, 1965 R. K. STEPHENS ETAL 3,171,796

METHOD OF PLATING HOLES

Filed Jan. 28, 1957

INVENTORS
ROY K. STEPHENS
RAYMOND C. GRIMSINGER
BY
Walter J. Jason
ATTORNEY

United States Patent Office 3,171,796
Patented Mar. 2, 1965

3,171,796
METHOD OF PLATING HOLES
Roy K. Stephens, Ontario, and Raymond C. Grimsinger, Pomona, Calif., assignors to General Dynamics Corporation, San Diego, Calif., a corporation of Delaware
Filed Jan. 28, 1957, Ser. No. 636,702
15 Claims. (Cl. 204—15)

This invention relates to a method of providing electrical conductivity between printed circuits on both sides of a circuit board and more particularly to a method of plating fabricated holes in etched circuit boards through the use of etching and plating techniques.

Heretofore the method of establishing electrical contact between circuitry printed or otherwise attached to the two flat surfaces of an insulating board was achieved most frequently by the use of metallic eyelets or terminals which had been staked or otherwise inserted and attached to fabricated holes in the board. The reliability of a part manufactured by this process depends entirely upon the workmanship of the staking or insertion process, and upon the effectiveness of subsequent soldering operations. Excessive radial or circumferential cracks and stress lines which may remain invisible under inspection are, as a result of the shortcomings of this process, frequent sources of failure. Likewise, stresses resulting from the fabrication procedure, when aggravated by vibration, excessive temperatures, as would occur during soldering, or other movements arising from environmental conditions, subject the affected part and hence, the associated component to possible failure. Specifically, a loose eyelet or terminal under vibration, could easily result in intermittent or faulty electrical contact in the soldered connection. Soldering, itself, under the above conditions, reduces reliability of the part, since there always exists the possibility of a "cold" soldered joint. The use of eyelets is therefore unreliable and has been replaced to some extent with plating techniques. Plating teciques had the additional advantage of a saving in time and cost, especially when 25 and more connections per board were desired. A plated metal resist technique was one of the most widespread methods used. This consisted of punching or drilling holes in a copper laminate board in the desired pattern. A conductive film was then applied to the walls of the fabricated holes. A masking material was then covered over the entire surface of the board except for the desired paths of the circuit design. The exposed paths of the circuit were then plated with an acceptable copper plating solution, plus a selected metal such as gold or solder. After this the masking material was removed and a board was etched in an etchant suitable for removing the unwanted metallic laminate not within the electrical path of the circuit design. However, this had the disadvantage that the edge of the copper laminate or foil under the plated path was exposed and subject to attack by the etching solution. The plated surface within the hole was also subject to attack by the etchant material.

Another method includes the insertion of a special plugging material in the plated holes of the board just prior to the etching of the remaining circuitry. Inadequate plugging of the holes permits the etchant to remove plate from the exposed areas and results in a faulty or incomplete plated through circuit. Precision tooling is required for drilling holes in the board and subsequent plating does not protect the path edges from the etchant solution.

The plating method comprising the present invention requires no extensive tooling and uses common plant facilities and plating techniques. This method utilizes a process for selectively plating holes in circuit boards composed of organic or other non-conductive insulating materials, so that the plate or metallic coating is integrally bonded to the hole wall surfaces, and so that electrical continuity may be established between associated circuitry on opposed sides of the board with a considerably greater degree of reliability than is currently obtained by eyelets or conventional plating methods. The circuit path or image is etched on the board by conventional techniques prior to the plating through of the holes instead of afterwards. This process involves the deposition of a metallic conductive coating on a board which has been prepared by the application of a strippable mask that is readily removable, the mask serving to leave exposed only the hole surfaces. This manually strippable mask protects the surfaces of the etched circuit pattern during the deposition of the conductive coating, and during subsequent plating. The hole surfaces, as a result of being sensitized and coated with a metallic coating, serve also as a conductive path to provide energy through the metallized holes and associated circuits on the opposite side of the insulating board for purposes of plating. No extensive tooling is required for the proper alignment of holes and the plating provides a complete protective coating on the edges of the path. No masking material such as a photo developed resist or a silk-screened material is necessary for masking purposes during the plating operation. The hole surfaces which have been plated by this method are easily and effectively soldered, since, inherent in the process is the phenomenon of capillary action of soldering on metallic surfaces whereby the molten solder readily flows along the length of the holes and, upon cooling, securely encases the component lead, solidly fills the hole volume, and provides a fillet of solder around the component lead as it emerges form the hole. An additional advantage of this method is that its employment does not obviate or otherwise modify production methods in present use for the fabrication of etched circuit boards. Rather, it is conceived to be a supplementary method which would perform the plating-through holes operation on any etched circuitry boards as they are produced, regardless of configuration. The use of this method permits the selective plating of a hole fabricated in any part of the etched circuit board without the necessity of plating adjacent or associated paths or non-conductive areas. Furthermore, since the mask of organic strippable coating is completely coated with the basic conductive (i.e., silver) film, the mask serves as a bus-bar for subsequent plating operations.

It is an object of this invention to provide a reliable electrical connection between circuits on either side of an insulating board.

Another object is to provide for a reliable conductive path from etched circuitry on one side of an insulated board through holes to associated etched circuitry on the other side.

Another object is the provision of a method of plating hole surfaces for the connection of circuits on both sides of an etched circuit board without modification of the fabrication of the circuit board.

Still another object is the provision of a method of plating hole surfaces wherein the etching of the conductive laminate is done before the holes are formed and plated.

Other objects and features of the present invention will be readily apparent to those skilled in the art from the following specification and appended drawings wherein is illustrated a preferred form of the invention, and in which.

Figures 1, 2, 3, 4, 5, 6, 7, 8, 9:
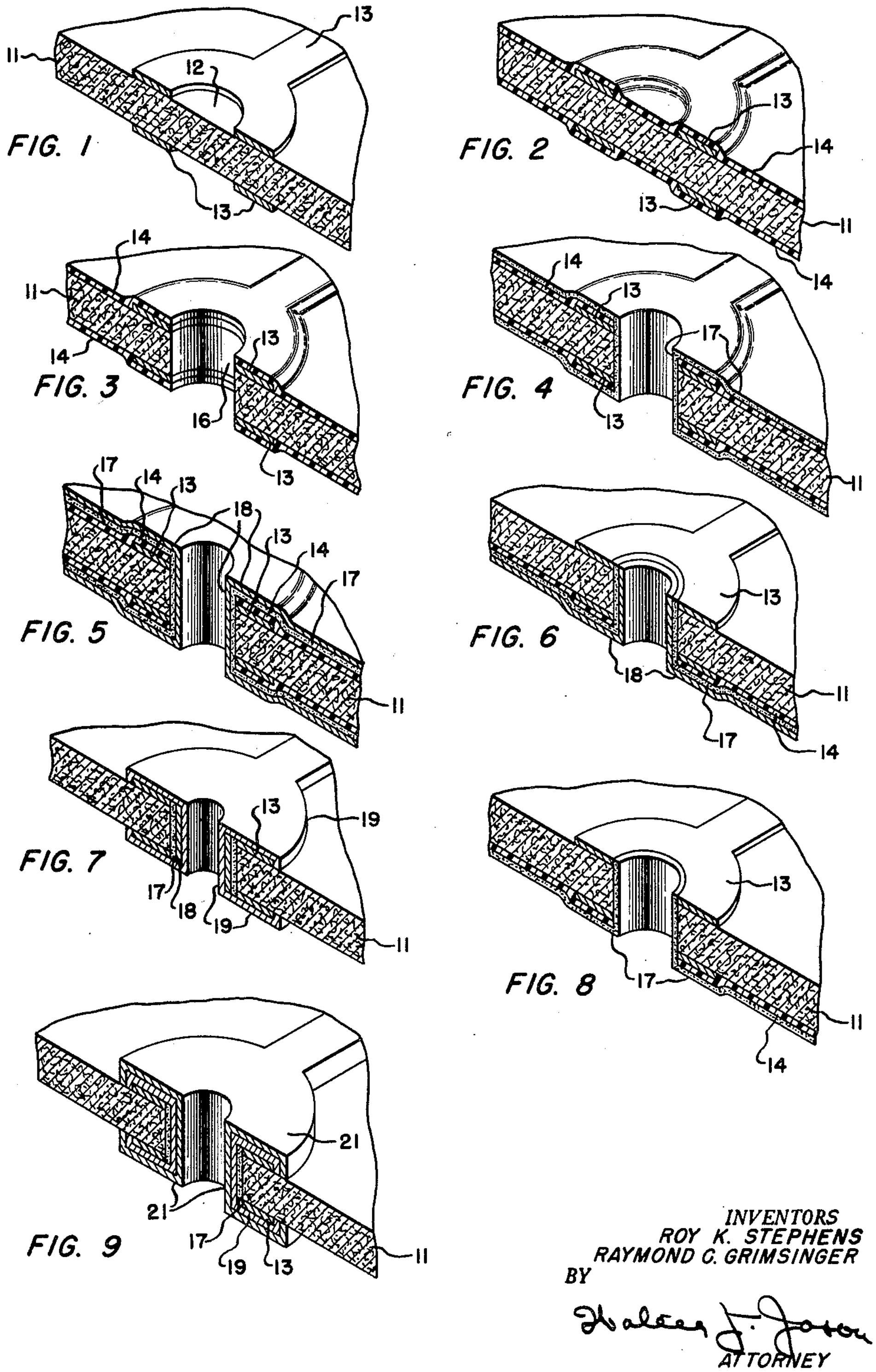
FIGURES 1 to 7 are cross-sectional views of the insulating board through the plated holes after each successive step in the preferred method of plating comprising the present invention.
FIGURES 8 and 9 are cross-sectional views of the insulating board through the plated holes after modified steps of the method of the invention.

The preferred method of plating holes in circuit boards according to the present invention first requires that the design circuit be etched on the board by conventional techniques before the holes are even made rather than after the holes have been made and plated as in former methods. The copper foil laminated insulated board is first prepared by cleaning the copper surfaces with an abrasive cleaner. Then by using conventional silk-screen or photo-developing techniques a resist material is deposited over the surface in accordance with the desired circuit design to protect the desired electrical paths of copper foil and exposing those areas to be etched. The boards are then etched in a suitable bath, usually ferric chloride, after which the resist material is removed by some suitable solvent. FIGURE 1 shows a previously etched circuit board 11 in cross section which has been etched by conventional (i.e., photo-resist or silk-screening) techniques. The pilot hole 12 has been sectioned and the copper foil circuit path 13 is shown in perspective. The circuit path 13 had previously been masked from the outer layer of copper foil on the conventional copper laminate insulated board before etching in the manner just described. Such a board is disclosed in Patent Number 2,758,074 of August 7, 1956, issuing to Black et al. Choice of the width of the copper circuitry depends upon design requirements of the selected circuit. After the circuit has been etched and before the holes have been drilled or punched the surface of board 11 including the etched circuit path 13 is coated with a strippable mask 14 as shown in FIGURE 2. The choice of masking material depends primarily upon the processing time considerations. The mask 14 is preferably of the type shown in British Patent 661,273, issuing November 21, 1951, which is semi-transparent, and through which the pilot holes 12 and associated circuitry 13 may be observed for the purpose of fabrication. The mask is usually applied by spraying, although dipping would be an acceptable process providing the thickness of the coating were carefully controlled.

Next, holes 16 are fabricated, by drilling or punching, in the masked, etched circuit board 11 as indicated by design requirements. This is shown in FIGURE 3. Because of the covering of mask 14, the hole surfaces are the only parts of the board and circuitry exposed, the remainder of the circuit board being enveloped in the organic mask coating. However, the edges of the base copper path 13 are exposed, as well as the internal surfaces of the hole. The surfaces of the hole 16 are sensitized by a short dip, one or two minutes, in a one to two percent solution of stannous chloride and then rinsed with ordinary tap water. This sensitization is used to increase the adherence of the deposited metallic silver film on the non-conductive surfaces. A film of conductive material 17 is next sprayed over all exposed surfaces, in particular, the surfaces of the fabricated holes 16. The following procedure appears to be the one most suitable for this application: An ammoniacal silver nitrate solution and a formaldehyde solution are simultaneously sprayed from a double-headed (i.e., dual nozzled) pressure spray gun; the combination of these two solutions on the surfaces results in a mixture from which, by chemical action, a metallic silver film 17 is deposited on the surfaces as shown in FIGURE 4, while the remaining products are easily removed by the subsequent rinsing operation. The metallic silver film overlying the strippable coating 14 will be removed with it. The masking material 14, as choice dictates, may be removed or retained at this point in the process. Thus, if preferred, the plating may be accomplished in a conventional manner without removing the mask, in which case the hole surfaces are plated to the desired thicknesses before removing the mask.

The basic conductive film 17, in this instance silver although this method is not to be confined thereto, serves as a bus-bar for subsequent plating operations. FIGURE 5 shows the application of copper plating 18 before the strippable mask 14 is removed. FIGURE 6 shows the next step wherein the top mask 14 has been peeled off. Excess surface coatings of silver and copper on the mask were also removed. After removal of the mask 14, additional platings may be made, if desired. For example, in FIGURE 7, the complete circuit of copper foil 13 on either side of the board 11 and the copper coating 18 within the hole may be replated with additional copper 19 to meet the required thickness of the circuit design. An additional corrosion protecting film of gold may also be added if desired.

Although the process hereinbefore described represents the preferred method of practicing the present invention, variations in the method are contemplated. For example, the first coating 17 within the hole 16 being electrically conductive, the first copper coating may be eliminated and the copper plating of coating 17 and the copper foil circuit 13 performed in one operation. Thus, FIGURE 8 shows the removal of the top masking 14 before the silver coating 17 in the hole has been additionally plated. FIGURE 9 shows in cross section that a single copper coating 19 was plated over the silver coat 17 within the hole and the copper foil circuit path 13. An additional gold plate 21 has been added as a corrosion protecting film.

While the foregoing method has been described as applied to laminated boards in which the circuit design is formed by etching away those portions of the laminate not within the circuit design, this method is also applicable to boards in which the surfaces are not laminated with a conductive coating. In this case the design is made by applying a conductive coating of the desired configuration on the surface. The strippable material is then applied, the holes are formed and coated, the strippable material removed and the circuit and hole surfaces plated in the conventional manner.

While certain preferred methods of the invention have been specifically disclosed, it is understood that the invention is not limited thereto as many variations will be readily apparent to those skilled in the art and the invention is to be given its broadest possible interpretation within the terms of the following claims.

What we claim is:

1. A method of plating holes in a board of insulating material to electrically connect electrical circuits on both sides thereof comprising the steps in the following sequence: forming conductive circuit paths on both sides of the board, applying masking material to the board and the conductive circuit paths, forming holes in the board in predetermined positions in contact with the conductive circuit paths, lining the holes with a conductive coating, electroplating the masking material and the conductive coating with an electrically conductive material, and removing the masking material and the material adhering thereto.

2. A method of plating holes in a board of insulating material to electrically connect printed circuits on both sides thereof comprising the steps in the following sequence: forming suitable conductive electrical paths along the surfaces of the board, coating the surfaces and the conductive electrical paths thereon with a masking material, forming holes in the board in a preselected arrangement along the conductive electrical paths, lining the holes with a conductive coating, plating the conductive coating with a conductive material, removing the masking material, and electroplating the conductive electrical paths and the conductive material within the holes with a plating of conductive material.

3. A method of plating holes in a board of insulating material to electrically connect printed circuits thereon comprising the following sequence of steps: forming suitable conductive electrical paths along at least one surface of the board, coating the surface and the conductive electrical paths thereon with a masking material, forming holes in the board in a preselected arrangement through the paths, lining the holes with a conductive coating, removing the masking material, and electroplating the coating and said paths with a plating of conductive material.

4. A method of plating holes in a board of insulating material to electrically connect conductive printed circuits on both sides thereof and to provide suitable connections for the soldering of components thereto comprising the following sequence of steps etching predesigned conductive circuit paths on the board to remove all conductive material on the surfaces thereof except desired conductive circuit paths and etching pilot holes along the paths designating the position where holes are to be made in the board, coating the surfaces of the board and conductive circuit paths with a masking material of sufficient clearness to determine the location of the pilot holes, fabricating holes through the board at positions shown by the pilot holes, lining the holes with a conductive coating, removing the masking material, and electroplating the coating and the conductive circuit paths with a conductive material to a desired thickness.

5. The method of plating holes defined in claim 4, wherein the surfaces of the holes are sensitized prior to receiving the conductive coating to cause good adhesion therewith.

6. A method of plating holes in a board of insulating material to electrically connect printed circuits on both sides thereof comprising the steps in the following sequence: forming suitable conductive electrical paths on the surfaces of the board, coating the surfaces with a readily removable material, fabricating holes through the board at desired points on the paths, sensitizing the surfaces of the holes to increase the adherence of later deposited material by dipping the board in a sensitizing solution, coating the hole surfaces with a conductive material by simultaneously spraying with an ammoniacal silver nitrate solution and formaldehyde solution, and then rinsing, and thereafter electroplating a conductive coating before removing the readily removable material and the conductive material adhering thereto.

7. A method of plating holes in a board of insulating material to electrically connect printed circuits on both sides thereof comprising the steps in the following sequence: forming suitable conductive electrical paths on the surfaces of the board, coating the surfaces and paths with a readily removable material, fabricating holes through the board at desired points on the paths, sensitizing the surfaces of the holes to increase the adherence of later deposited material by dipping the board in a sensitizing solution, coating the hole surfaces with a conductive material by simultaneously spraying with an ammoniacal silver nitrate solution and formaldehyde solution, and then rinsing, removing the readily removable material, and thereafter electroplating at least one conductive coating on all exposed conductive surfaces.

8. A method of plating holes in a board of insulating material to electrically connect printed circuits on both sides thereof comprising the following sequence of steps: forming suitable conductive electrical paths on the surfaces of the board, coating the surfaces with a readily removable material, fabricating holes through the board at desired points on the paths, sensitizing the surfaces of the holes to increase the adherence of later deposited material by exposing the surfaces to a 1% to 2% solution of stannous chloride and rinsing with water, coating the hole surfaces with a conductive material by simultaneously spraying with an ammoniacal silver nitrate solution and formaldehyde solution, and then rinsing, and thereafter electroplating a conductive coating before removing the readily removable material and the materials adhering thereto.

9. A method of plating holes in a board of insulating material to electrically connect printed circuits on both sides thereof comprising the following sequence of steps: forming suitable conductive electrical paths on the surfaces of the board, coating the surfaces with a readily removable material, fabricating holes through the board at desired points on the paths, sensitizing the surfaces of the holes to increase the adherence of later deposited material by exposing the surfaces thereof to a 1% to 2% solution of stannous chloride and rinsing with water, coating the hole surfaces with a conductive material by simultaneously spraying with an ammoniacal silver nitrate solution and formaldehyde solution, and then rinsing, removing the readily removable material, and thereafter electroplating at least one conductive coating on all exposed conductive surfaces.

10. The method of plating holes in circuit boards comprising the steps in the following sequence: forming at least one conductive circuit path on the board, applying suitable masking material to the board and the conductive circuit path, forming holes in the board in predetermined positions and in contact with the conductive circuit path, coating the holes with a conductive film, electroplating the masking material and the conductive film with an electrically conductive material, and removing the masking material and the material adhering thereto.

11. The method of plating holes in circuit boards comprising the following sequence of steps: forming at least one conductive circuit path on the board, applying suitable masking material to the board and the conductive circuit path, forming holes in the board in predetermined positions and in contact with the conductive circuit path, coating the holes with a conductive film, removing the masking material, electroplating the conductive film and the conductive circuit path with an electrically conductive material.

12. The method of plating holes in circuit boards comprising the steps in the following sequence: preparing a copper foil laminated board, depositing resist material over the desired surface of the copper foil thus defining and protecting at least one desired conductive circuit path, removing the exposed copper foil, removing the resist material, masking the board and the conductive circuit path with suitable material, forming holes in the conductive circuit path, sensitizing the surfaces of the formed holes, coating all surfaces with a film of conductive material, plating all surfaces, and removing the masking material.

13. The method defined in claim 12, additionally including the steps of plating the holes and the conductive circuit path with a film of protective material.

14. The method of plating holes in a board of insulating material to electrically connect at least one conductive circuit path thereon comprising the following sequence of steps: providing a board having at least one conductive circuit path thereon, applying masking material to the board and the conductive circuit path, forming holes in the board in predetermined positions in contact with the conductive circuit path, lining the holes with a conductive coating, electroplating the masking material and the conductive coating with an electrically conductive material, and removing the masking material and the material adhering thereto.

15. A method of plating holes in a board of insulating material to electrically connect at least one conductive circuit path thereon comprising the following sequence of steps: providing a board having at least one conductive circuit path thereon, applying masking material to the board and the conductive circuit path, forming holes in the board in predetermined positions in contact with the conductive circuit path, lining the holes with a conductive coating, removing the masking material, and electroplating the conductive circuit path and the conductive coating within the holes with a conductive material.

(References on following page)

References Cited by the Examiner

UNITED STATES PATENTS

| | | | |
|---|---|---|---|
| 2,225,729 | 12/40 | White | 117—5.5 |
| 2,372,488 | 3/45 | Hampson | 204—15 |
| 2,539,442 | 1/51 | Larson | 204—15 |
| 2,699,424 | 1/55 | Nieter | 204—15 |
| 2,748,031 | 5/56 | Kafig | 117—8.5 |
| 2,783,193 | 2/57 | Nieter | 204—15 |
| 2,793,178 | 5/57 | Morris | 204—15 |
| 2,834,723 | 5/58 | Robinson | 204—15 |
| 2,848,359 | 8/58 | Talmey | 204—15 |
| 2,872,391 | 2/59 | Hauser et al. | 204—15 |

FOREIGN PATENTS

| | | |
|---|---|---|
| 724,379 | 2/55 | Great Britain. |

OTHER REFERENCES

"Product Engineering," April 1948, pages 158–160.

"Formica Copper Clad," 1954, page 4, 41/Pri. Div.

Principles of Electroplating and Electroforming, 2nd edition, Blum et al. (1949), McGraw-Hill Book Co., Inc., New York, N.Y., page 226.

JOHN H. MACK, *Primary Examiner.*

JOHN R. SPECK, JOSEPH REBOLD, *Examiners.*